United States Patent
Kido et al.

(10) Patent No.: US 12,121,858 B2
(45) Date of Patent: Oct. 22, 2024

(54) MANUFACTURING METHOD FOR EXHAUST GAS PURIFICATION DEVICE

(71) Applicant: CATALER CORPORATION, Kakegawa (JP)

(72) Inventors: Yuki Kido, Kakegawa (JP); Suguru Matsui, Kakegawa (JP); Etsuko Ohara, Kakegawa (JP); Kazuma Nakada, Kakegawa (JP)

(73) Assignee: CATALER CORPORATION, Kakegawa (JP)

( * ) Notice: Subject to any disclaimer, the term of this patent is extended or adjusted under 35 U.S.C. 154(b) by 919 days.

(21) Appl. No.: 16/959,896

(22) PCT Filed: Nov. 8, 2019

(86) PCT No.: PCT/JP2019/043997
§ 371 (c)(1),
(2) Date: Jul. 2, 2020

(87) PCT Pub. No.: WO2020/129460
PCT Pub. Date: Jun. 25, 2020

(65) Prior Publication Data
US 2021/0086133 A1    Mar. 25, 2021

(30) Foreign Application Priority Data
Dec. 19, 2018    (JP) ................. 2018-237626

(51) Int. Cl.
*B01D 53/94* (2006.01)
*B01J 37/02* (2006.01)
(Continued)

(52) U.S. Cl.
CPC .......... *B01D 53/94* (2013.01); *B01J 37/0228* (2013.01); *B05D 7/24* (2013.01); *B05B 1/18* (2013.01);
(Continued)

(58) Field of Classification Search
CPC ........ B01D 53/94; B01J 37/0228; B05D 7/24; B05D 1/02; B05B 1/18; B05B 12/32;
(Continued)

(56) References Cited

U.S. PATENT DOCUMENTS 4,208,454 A * 6/1980 Reed .................. B05D 7/22
427/443.2
6,627,257 B1 * 9/2003 Foerster .............. B01J 37/0215
427/430.1
(Continued)

FOREIGN PATENT DOCUMENTS

CN       207972412 U    10/2018
DE       3808606 A * 7/1989 ............. B05B 12/06
(Continued)

OTHER PUBLICATIONS

Jan. 28, 2020 Search Report issued in International Patent Application No. PCT/JP2019/043997.

*Primary Examiner* — Brian K Talbot
(74) *Attorney, Agent, or Firm* — Oliff PLC

(57) ABSTRACT

A production method of an exhaust gas purification device includes the steps of supplying a solution containing a catalyst metal from a shower nozzle to an upper part of a honeycomb substrate, coating the honeycomb substrate with the solution, and firing the honeycomb substrate coated with the solution, wherein the shower nozzle has a plurality of discharge openings for discharging the solution and a guard which surrounds the plurality of discharge openings.

7 Claims, 6 Drawing Sheets

(51) Int. Cl.
*B05D 7/24* (2006.01)
*B05B 1/18* (2006.01)
*B05B 12/26* (2018.01)
*B05B 12/32* (2018.01)
*B05D 1/02* (2006.01)
*C23C 16/455* (2006.01)

(52) U.S. Cl.
CPC ............... *B05B 12/26* (2018.02); *B05B 12/32* (2018.02); *B05D 1/02* (2013.01); *C23C 16/45565* (2013.01); *H01L 2224/75184* (2013.01); *Y10S 4/903* (2013.01)

(58) Field of Classification Search
CPC .......... B05B 12/36; B05C 5/02; B05C 5/027; B05C 17/005; Y10S 4/903; H01L 2224/75184; C23C 16/45565
USPC ....................................................... 427/421.1
See application file for complete search history.

(56) References Cited

U.S. PATENT DOCUMENTS

| | | | | |
|---|---|---|---|---|
| 7,323,054 | B2* | 1/2008 | Aderhold | B01J 37/0215 |
| | | | | 118/429 |
| 8,302,557 | B2* | 11/2012 | Goshima | B01J 37/0215 |
| | | | | 427/232 |
| 9,096,923 | B2* | 8/2015 | Clinton | C23C 18/125 |
| 9,636,693 | B2* | 5/2017 | Nakano | B01J 35/04 |
| 9,919,302 | B2* | 3/2018 | Masson | B05B 1/3402 |
| 10,814,318 | B2* | 10/2020 | Arulraj | B05D 3/0493 |
| 11,236,657 | B2* | 2/2022 | Tanaka | B01J 35/04 |
| 11,420,224 | B2* | 8/2022 | Burgess | B01J 37/0215 |
| 2010/0093527 | A1* | 4/2010 | Hasselmann | B01J 35/56 |
| | | | | 502/334 |
| 2011/0305610 | A1* | 12/2011 | Lambert | B01J 37/0211 |
| | | | | 118/50 |
| 2012/0021896 | A1 | 1/2012 | Nakano et al. | |
| 2014/0375721 | A1* | 12/2014 | Kritchman | B41J 2/1714 |
| | | | | 347/28 |
| 2018/0047563 | A1* | 2/2018 | deVilliers | H01L 21/0275 |
| 2018/0221925 | A1* | 8/2018 | Ito | H01L 21/67051 |
| 2019/0262845 | A1* | 8/2019 | Bruce | B05B 1/3006 |

FOREIGN PATENT DOCUMENTS

| | | | |
|---|---|---|---|
| EP | 3 603 806 A1 | 2/2020 | |
| JP | 2006-15205 A | 1/2006 | |
| JP | 2015-77543 A | 4/2015 | |
| JP | 2015-85241 A | 5/2015 | |
| JP | 2016-34781 A | 3/2016 | |
| WO | 2010/114132 A1 | 10/2010 | |
| WO | WO-2017163984 A1 * | 9/2017 | ....... B01D 46/24492 |
| WO | 2018/180090 A1 | 10/2018 | |

* cited by examiner (a)

(b)

MANUFACTURING METHOD FOR EXHAUST GAS PURIFICATION DEVICE

FIELD

The present invention relates to a production method of an exhaust gas purification device. In particular, the present invention relates to a production method of an exhaust gas purification device wherein the method enables uniform coating over long periods of time by preventing the occurrence of clogging in the discharge openings of the nozzle for supplying a solution containing catalyst metal.

BACKGROUND

Exhaust gas purification devices include, for example, a honeycomb substrate and a catalyst layer formed on the honeycomb substrate. Such exhaust gas purification devices are produced by, for example, applying a solution containing catalyst metal for forming the catalyst layer to the honeycomb substrate and thereafter drying and firing the honeycomb substrate.

For example, Patent Literature 1 discloses a device for applying such a solution containing catalyst metal to a honeycomb substrate. In Patent Literature 1, after the solution containing catalyst metal is supplied to a solution storage part of an upper part of the honeycomb substrate, the liquid level of the solution stored in the solution storage part is made uniform by an uniformization mechanism. Thereafter, the solution stored in the solution storage part is suctioned from the lower side of the honeycomb substrate, whereby the honeycomb substrate is uniformly coated with the solution.

Patent Literature 2 discloses a nozzle for supplying a high-viscosity solution to an upper part of a honeycomb substrate. Patent Literature 2 discloses that solution can be reliably discharged from discharge openings located in an end surface portion of the nozzle. By adopting such a nozzle, the discharged solution can accumulate in only a central portion of the upper part of the honeycomb substrate, whereby the honeycomb substrate can be uniformly coated with the solution.

The inventions described in Patent Literature 1 and 2 are mainly suitable for coating honeycomb substrates with a high-viscosity solution.

Patent Literature 3 discloses a method for producing an exhaust gas purification device with which a honeycomb substrate can be uniformly coated with a solution even when a low-viscosity solution is used.

An example of a honeycomb substrate coating method according to the prior art is shown in FIG. 5. In this method, a solution (20) is supplied from a nozzle (10) to an upper part of a honeycomb substrate (30). At this time, a guide (40) is used as needed, whereby leakage of the solution (20) from the upper part of the honeycomb substrate (30) and the flow of the solution (20) down the outside surface of the honeycomb substrate (30) are prevented. The honeycomb substrate (30) is placed on a support (50), and a duct (60) is connected to the support (50). The solution (20) collected in the upper part of the honeycomb substrate (30) is suctioned by the duct (60), whereby the honeycomb substrate (30) is coated with the solution (20). Note that though the step of supplying the solution (20) from the nozzle (10) and the step of suctioning the solution (20) by the duct (60) are illustrated as taking place in the same working area in the method of FIG. 5, these steps may be performed in different working areas.

Note that in recent years, the use of ceria-zirconia composite oxide promoter particles as a constituent material of honeycomb substrates rather than in the catalyst layer has been studied. For example, Patent Literature 4 discloses an exhaust gas purification device in which a honeycomb substrate includes ceria-zirconia composite oxide particles.

These documents are incorporated herein by reference. Such a honeycomb substrate and exhaust gas purification device are also disclosed in Patent Literature 5 and 6.

CITATION LIST

Patent Literature

[PTL 1] JP 2006-15205 A
[PTL 2] WO 2010/114132
[PTL 3] WO 2018/180090
[PTL 4] JP 2015-85241 A
[PTL 5] JP 2015-77543 A
[PTL 6] JP 2016-34781 A

SUMMARY

Technical Problem

In the prior art, if solution is supplied for a long period of time, the discharge openings of the nozzle clog, and the solution is not supplied from the clogged portions, and as a result, there is a problem that it is impossible to uniformly coat the honeycomb substrate.

An object of the present invention is to provide a production method for an exhaust gas purification device wherein the method enables uniform coating over long periods of time.

Solution to Problem

The present inventors have discovered that the problem described above can be solved by the present invention having the following Aspects.

<<Aspect 1>>

A production method of an exhaust gas purification device, comprising the steps of:

supplying a solution containing catalyst metal from a shower nozzle to an upper part of a honeycomb substrate, coating the honeycomb substrate with the solution, and firing the honeycomb substrate coated with the solution, wherein the shower nozzle has a plurality of discharge openings for discharging the solution and a guard which surrounds the plurality of discharge openings.

<<Aspect 2>>

The production method according to Aspect 1, wherein the guard protrudes from the discharge openings of the shower nozzle by a length of 5 mm or more.

<<Aspect 3>>

The production method according to Aspect 1 or 2, wherein an average distance between the guard and the discharge opening nearest to the guard is 1 mm or more and 20 mm or less.

<<Aspect 4>>

The production method according to any one of Aspects 1 to 3, wherein an average aperture diameter of the discharge openings is 0.3 mm or more and 3 mm or less.

<<Aspect 5>>

The production method according to any one of Aspects 1 to 4, wherein the discharge openings of the shower nozzle are located on a convex portion of the shower nozzle.

<<Aspect 6>>

The production method according to any one of Aspects 1 to 5, wherein the viscosity of the solution at a shear rate of 4 s$^1$ is 1 mPa·s or more and 20000 mPa·s or less.

<<Aspect 7>>

The production method according to any one of Aspects 1 to 6, wherein the supplying of the solution from the shower nozzle includes using a guide to prevent leakage of the solution from the upper part of the honeycomb substrate.

DESCRIPTION OF EMBODIMENTS

The production method of the exhaust gas purification device of the present invention includes the steps of supplying a solution containing catalyst metal from a shower nozzle to an upper part of a honeycomb substrate, coating the honeycomb substrate with the solution, and firing the honeycomb substrate coated with the solution. The shower nozzle used in the present invention has a plurality of discharge openings for discharging the solution and a guard which surrounds the plurality of discharge openings.

In the exhaust gas purification device production method of the prior art, when a solution containing catalyst metal is continuously supplied for long periods of time, the discharge openings of the nozzle may clog in some cases. In such a case, solution is not supplied from the clogged portions, and as a result, the honeycomb substrate cannot be uniformly coated. The present inventors have conducted various investigations in regards to the causes thereof. For example, the time from the supply of solution to a honeycomb substrate to the supply of solution to a subsequent honeycomb substrate, the solution supply speed, the composition and viscosity of the solution, aggregates in the solution, suction conditions, and the production environment have been investigated.

Among these, the present inventors have discovered that the discharge openings of the nozzle are particularly likely to become clogged when production of an exhaust gas purification device is carried out in a low humidity environment. The present inventors have carried out further investigations, and have discovered that by installing a guard around the discharge openings of the shower nozzle and making the area around the discharge openings a moist environment, even if an exhaust gas purification device is manufactured in a low humidity environment, clogging of the discharge openings of the nozzle can be prevented.

Figure 1:
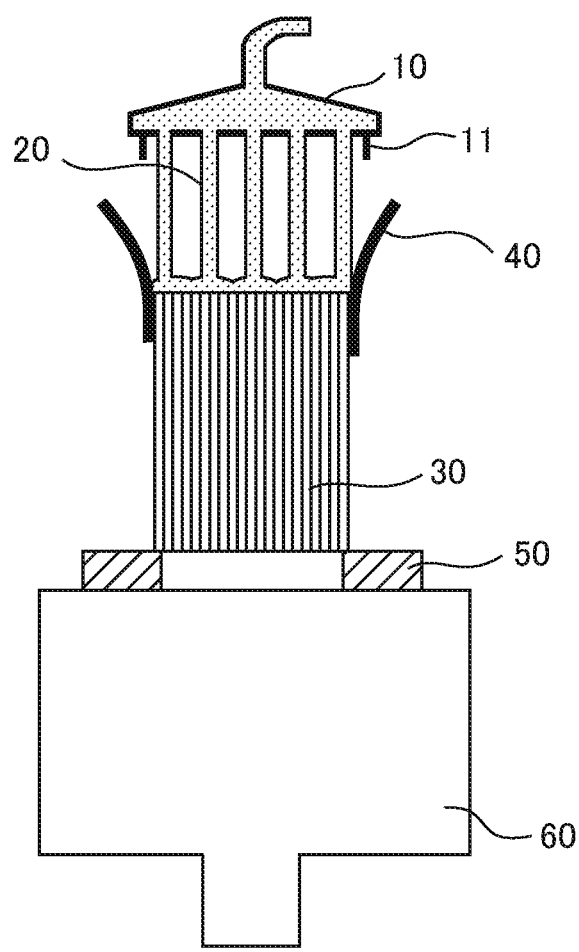
FIG. 1 is a schematic view showing an aspect of a device used in the method of the present invention for coating a honeycomb substrate with a solution containing catalyst metal.

As shown in FIG. 1, in the present method, a guard (11) is present on the nozzle (10) for supplying the solution containing catalyst metal (20). The solution (20) is supplied from the nozzle (10) having this guard (11) to an upper part of the honeycomb substrate (30). At this time, a guide (40) is used as needed, whereby the level of the solution (20) is made uniform and/or leakage of the solution (20) from the upper part of the honeycomb substrate (30) and the flowing of the solution (20) from down the outside surface of honeycomb substrate (30) are prevented. The honeycomb substrate (30) is placed on a support (50), and a duct (60) is connected to the support (50). The solution (20) accumulated in the upper part of the honeycomb substrate (30) is suctioned by the duct (60), whereby the honeycomb substrate (30) is coated with the solution (20). Note that though the step of supplying the solution (20) from the nozzle (10) and the step of suctioning the solution (20) with the duct (60) are carried out in the same working area in the method of FIG. 1, these steps may be carried out in different working areas.

Figure 2:
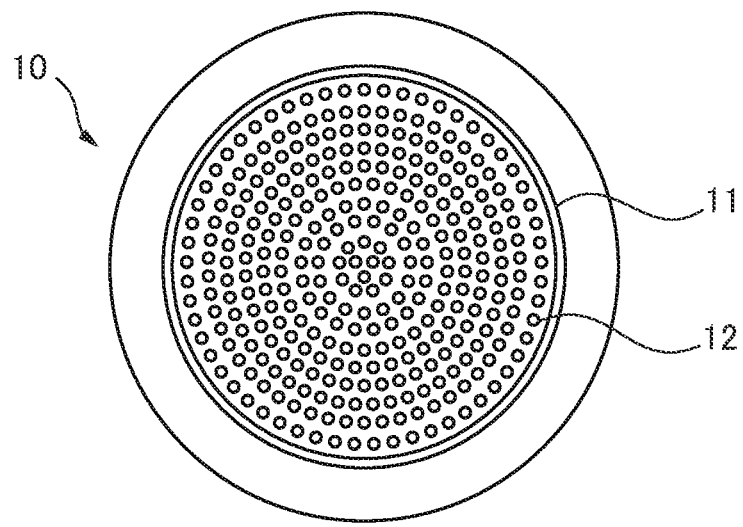
FIG. 2($a$) is a bottom view of an aspect of a shower nozzle used in the production method of the present invention and FIG. 2($b$) is a perspective view of the shower nozzle of FIG. 2($a$).
Figure 2:
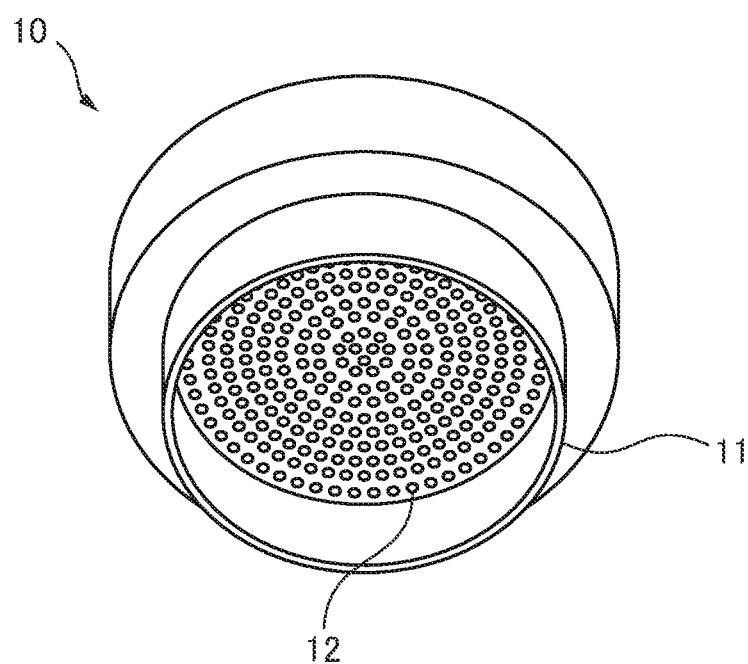

As shown in FIGS. 2($a$) and ($b$), a plurality of discharge openings (12) from which solution is discharged are present in the nozzle (10), and a guard (11) is present around the plurality of discharge openings (12).

<Shower Nozzle>

In the method of the present invention, the solution containing catalyst metal is supplied from the shower nozzle to an upper part of the honeycomb substrate. A plurality of discharge openings from which the solution is discharged and a guard which surrounds the plurality of discharge openings are present in the shower nozzle.

The guard protrudes downwardly from the surface of the shower nozzle, and preferably protrudes by a length of 5 mm or more, 8 mm or more, 10 mm or more, or 15 mm or more. The protruding length may be 100 mm or less, 50 mm or less, 30 mm or less, 20 mm or less, or 10 mm or less. For example, the protruding length may be 5 mm or more and 100 mm or less, or 10 mm or more and 50 mm or less. The protruding length is measured from the discharge openings of the shower nozzle, and is measured from the end portion of the convex shape when the discharge openings are on a convex portion of the surface of the nozzle. When the discharge openings are located on the convex portion at various heights, or when the surface of the nozzle where the discharge openings are present has various heights, measurement can basically be made from the discharge opening at the tip of the nozzle, and the position of the reference of the protruding length of the guard can be determined in view of the indispensable feature of the present invention, wherein the guard prevents non-uniform coating due to clogging as a result moisturizing multiple discharge openings when the guard is used.

Though a smaller distance between the guard and the discharge opening nearest to the guard is preferable from the viewpoint of making the area around the discharge opening a moist environment, if the distance is excessively small, the solution containing catalyst metal adheres to the guard, causing loss of the catalyst metal. For example, the average distance between the guard and the discharge opening nearest to the guard may be 1 mm or more, 3 mm or more, or 5 mm or more, and may be 20 mm or less, 10 mm or less, 8 mm or less, 5 mm or less, or 3 mm or less. For example, the average distance may be 1 mm or more and 10 mm or less, or 4 mm or more and 6 mm or less. This distance is determined from the guard and the portion nearest to the perimeter of the hole of the discharge opening, and regarding the average distance, among the discharge openings, only the distance from the guard of the discharge opening present on the outermost side of the nozzle is considered, and the average is calculated. However, also in this case, the reference position of the distance can be determined in consideration of the indispensable feature of the present invention wherein the guard is used to moisten a large number of discharge openings to prevent uneven coating due to clogging.

The hole diameter of the discharge openings is not particularly limited, and the hole diameter is preferably small so that solution does not drip from the discharge openings of the shower nozzle when the solution is not intended to be supplied. For example, as an average aperture diameter expressed as the average of the equivalent diameter, the hole diameter may be 0.30 mm or more, 0.50 mm or more, 0.70 mm or more, or 0.90 mm or more, and may be 3.00 mm or less, 2.50 mm or less, 2.00 mm or less, 1.50 mm or less, or 1.30 mm or less. For example, the average of the hole diameter may be 0.30 mm or more and 3.00 mm or less, or 0.50 mm or more and 1.50 mm or less. "Equivalent diameter" as used herein means the value De represented by formula (1) below.

$$De = 4Af/Wp \qquad (1)$$

In formula (1), De is the equivalent diameter, Af is the cross-sectional area of the discharge opening, and Wp is the circumference of the discharge opening.

The hole shape of the discharge openings is not particularly limited. Furthermore, it is not necessary that the hole diameters and shapes of all of the discharge openings be the same, and they may vary within ranges in which the effects of the present invention can be achieved.

It is preferable that the shower nozzle be present directly above the honeycomb substrate, and the discharge openings be present at substantially equal intervals over the entire upper surface of the honeycomb substrate located thereunder. In this case, the discharge openings may be arranged substantially uniformly in a grid pattern or may be arranged substantially uniformly in a concentric manner. For example, the discharge openings may be substantially uniformly arranged in various manners as described in Patent Literature 2.

Figure 3:
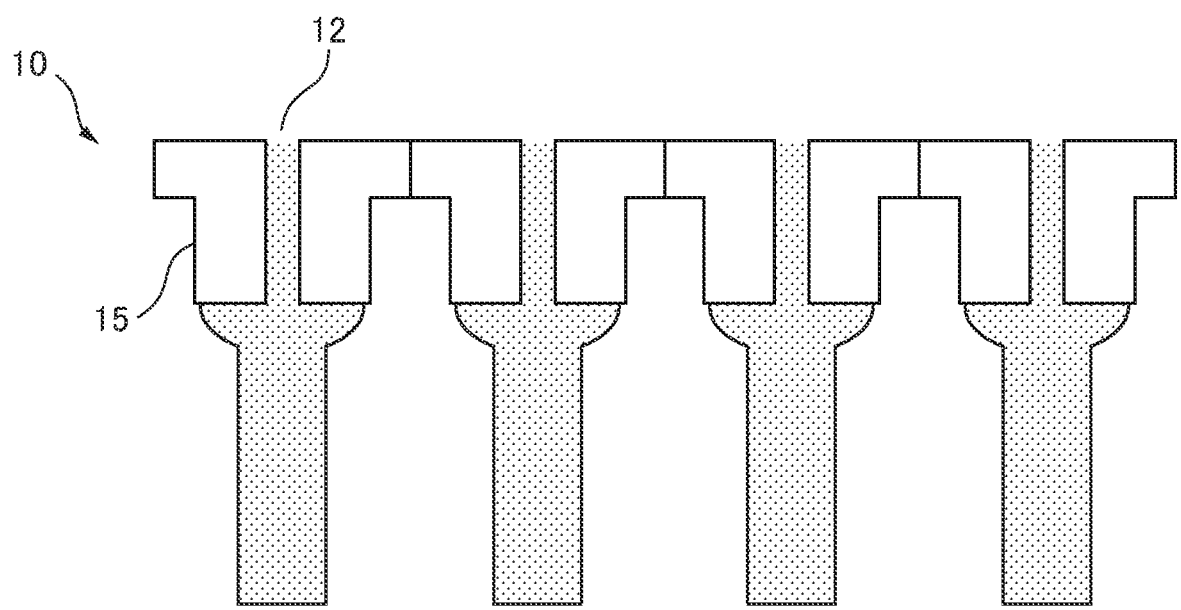
FIG. 3 shows an aspect of the shower nozzle used in the production method of the present invention in which discharge openings are present in a convex portion.

The discharge openings may be present in the convex portion which protrudes from the surface of the shower nozzle. When the discharge openings are present in the convex portion, the solution expelled from the discharge openings spreads only to the width of the tip of the convex portion, making it unlikely for convergence of the solution discharged from adjacent discharge openings to occur, which is preferable. For example, as shown in FIG. 3, a plurality of protrusions (15) may be present on the surface of the shower nozzle (10), and the discharge openings (12) may be present in approximately the centers of the protrusions (15). The shapes of the convex portions are not limited to the trapezoidal shape shown in FIG. 3, and are not particularly limited as long as the convergence of discharged solution can be prevented.

Figure 4:
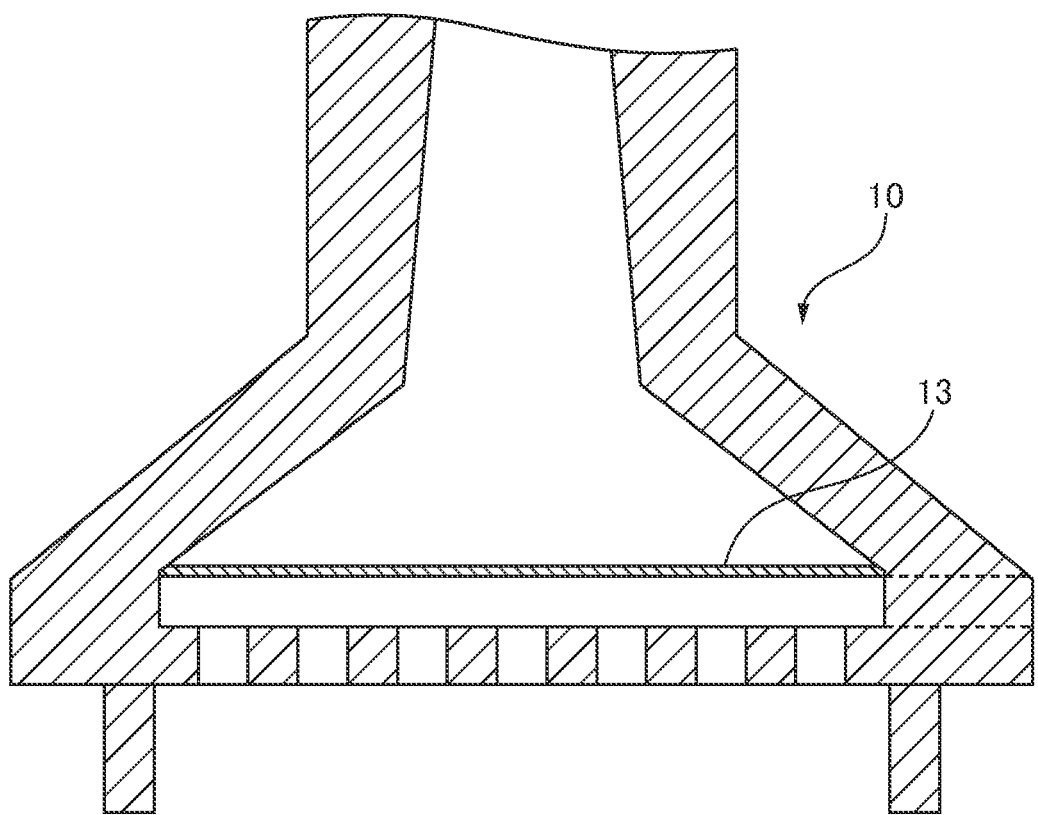
FIG. 4 is a schematic view showing an example of a shower nozzle having a rectifying plate.
Figure 5:
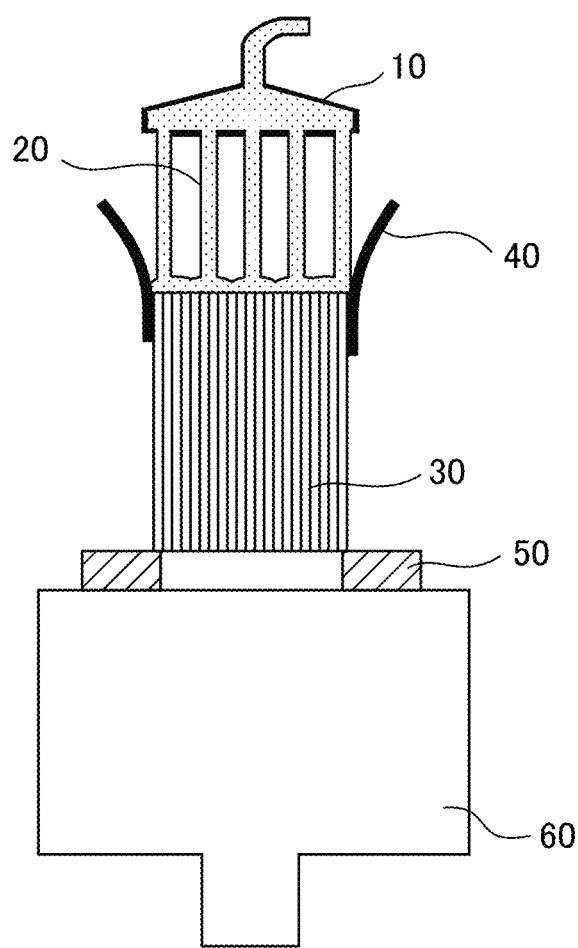
FIG. 5 is a schematic view showing an aspect of the conventionally used device for coating a honeycomb substrate with a solution containing catalyst metal.

A rectifying plate (13) as shown in FIG. 4 can be provided in the interior of the shower nozzle so that the solution from each discharge opening of the shower nozzle can be uniformly discharged. As long as the rectifying plate (13) is for supplying the solution uniformly across the entire surface of the upper part of the honeycomb substrate, the shape thereof is not limited. For example, the rectifying plate (13) may be a plate having the same holes as the discharge surface of the shower nozzle described above, or may be the deflector described in Patent Literature 2.

<Solution Containing Catalyst Metal>

The viscosity of the solution containing catalyst metal used in the method of the present invention is not particularly limited, and the solution is not particularly limited as long as it is a slurry for forming a catalyst layer of an exhaust gas purification device or a solution for supporting a catalytic metal on a honeycomb substrate containing ceria-zirconia composite oxide particles as one of constituent materials.

The slurry for forming the catalyst layer may be a catalyst layer formation slurry for three-way catalytic converters for gasoline engines or may be a known catalyst layer formation slurry for the purification devices for diesel engines or lean-burn engines. Such a slurry is conventionally an aqueous dispersion in which at least an inorganic oxide or inorganic composite oxide carrier such as alumina, zirconia, or ceria, and catalyst metal particles (platinum, palladium, or rhodium) supported thereon are dispersed.

Examples of the solution for supporting the catalyst metal include solutions including a catalyst metal salt. Examples of the catalyst metal salt include strong acid salts of platinum and/or palladium, and in particular, include platinum and/or palladium nitrates and sulfates. When the solution contains a rhodium salt, the same salt can be used. The solution for supporting the catalyst metal may further contain an inorganic oxide or inorganic composite oxide carrier as contained in the slurry for forming a catalyst layer.

When the viscosity of the solution containing catalyst metal is low, clogging is likely to occur in the discharge openings of the shower nozzle, and even when the viscosity is high, clogging occurs depending on conditions such as humidity. The viscosity of the solution containing catalyst metal at, for example, a shear rate of $4\ s^{-1}$ may be 1 mPa·s or more, 5 mPa·s or more, 10 mPa·s or more, 20 mPa·s or more, 50 mPa·s or more, 100 mPa·s or more, 200 mPa·s or more, 500 mPa·s or more, or 1000 mPa·s or more, and may be 20000 mPa·s or less, 15000 mPa·s or less, 10000 mPa·s or less, 5000 mPa·s or less, 2000 mPa·s or less, 1500 mPa·s or less, 1000 mPa·s or less, 700 mPa·s or less, 600 mPa·s or less, 500 mPa·s or less, 400 mPa·s or less, 300 mPa·s or less, 250 mPa·s or less, or 200 mPa·s or less. For example, the viscosity of the solution containing catalyst metal at a shear rate of $4\ s^{-1}$ may be 1 mPa·s or more and 20000 mPa·s or less, 1 mPa·s or more and 2000 mPa·s or less, 5 mPa·s or more and 1000 mPa·s or less, or 10 mPa·s or more and 300 mPa·s or less. Viscosity measurement is carried out using an E-type viscosity meter (TVE-35H, manufactured by Toki Sangyo Co., Ltd.) using a 1°34'×R24 rotor at a measurement temperature of 25° C.

The solution containing catalyst metal may contain, for adjusting the viscosity, a thickener at a quantity of 1.0 wt % or less, 0.5 wt % or less, 0.3 wt % or less, or 0.1 wt % or less. Examples of the thickener include water-soluble organic polymers.

<Honeycomb Substrate>

The honeycomb substrate used in the method of the present invention is not particularly limited as long as it is a honeycomb substrate for exhaust gas purification devices known in the relevant field. Specifically, a honeycomb substrate having a large number of cells can be used as the honeycomb substrate, for example, a heat-resistant ceramic material such as cordierite ($2MgO \cdot 2Al_2O_3 \cdot 5SiO_2$), alumina, zirconia, and silicon carbide, and a metal material made of a metal foil such as stainless steel can be used.

The honeycomb substrate used in the method of the present invention may be a honeycomb substrate containing ceria-zirconia composite oxide particles as one of the constituent materials. For example, the honeycomb substrates described in Patent Literature 4 to 6 may be used as such a honeycomb substrate, which are different from the currently used honeycomb substrate composed of cordierite described above.

The honeycomb substrate may be a wall-flow type honeycomb substrate or may be a straight-flow type honeycomb substrate. In the honeycomb substrate, the opening diameters of the cells on the front side (engine side) may be different from the opening diameters of the cells on the rear side. The method of the present invention is particularly advantageous when a solution containing catalyst metal having a low viscosity is used and when producing an exhaust gas purification device obtained using a wall-flow type honeycomb substrate because the pressure loss of the obtained exhaust gas purification device is reduced.

The number of cells of the honeycomb substrate may be, for example, 300 cells/in$^2$ or more, 500 cells/in$^2$ or more, 800 cells/in$^2$ or more, 1000 cells/in$^2$ or more, or 1200 cells/in$^2$ or more, and may be 2000 cells/in$^2$ or less, 1500 cells/in$^2$ or less, 1200 cells/in$^2$ or less, 1000 cells/in$^2$ or less, or 800 cells/in$^2$ or less.

<Solution Containing Catalyst Metal Supply Step>

The step of supplying the solution containing catalyst metal is carried out in accordance with the characteristics of the present invention described above. Regarding the portions not related to the characteristics of the present invention, this step can be carried out in the same manner as the prior art. For example, regarding the portions not related to the characteristics of the present invention, refer to Patent Literature 2.

In the step of supplying the solution containing catalyst metal, a guide can be used to prevent leakage of the solution from the upper part of the honeycomb substrate and flow of the solution along the outside surface of the honeycomb substrate, and/or to uniformize the liquid surface of the solution supplied to the upper part of the substrate. The guide may be the same as the guide disclosed in Patent Literature 2. Thus, prior to the step of supplying the solution containing catalyst metal, a step of attaching the guide to the honeycomb substrate may be carried out, and this step may be carried out at a station different from the station at which the step of supplying the solution containing catalyst metal.

<Solution Coating Step>

In the step of coating the honeycomb substrate with the solution supplied to the upper part of the honeycomb substrate, suction may be carried out from the lower side of the honeycomb substrate to promote downward flow of the solution, as described in Patent Literature 1 and 2. However, when a low viscosity solution containing catalyst metal is used, suction may not be carried out.

When suction is carried out, suction may be carried out at a station different from that of the solution containing catalyst metal supply step. In this case, the honeycomb substrate in which the solution is retained by the guide moves from the station at which the solution supply step is carried out to a suctioning station.

<Firing Step>

Tough the firing conditions of the substrate coated with the solution containing catalyst metal depend on the composition of the solution containing catalyst metal used and are not particularly limited, firing can be carried out at, for example, a temperature of 400 to 1000° C. for a time of approximately 1 to 4 hours. A drying step may be carried out prior to firing, and though the conditions thereof also depend on the composition of the solution containing catalyst metal used and are not particularly limited, drying can be carried out at, for example, a temperature of 80 to 300° C. for a time of 1 to 12 hours.

The present invention will be more specifically described by way of the Examples below, but the present invention is not limited thereby.

EXAMPLES

Figure 6:
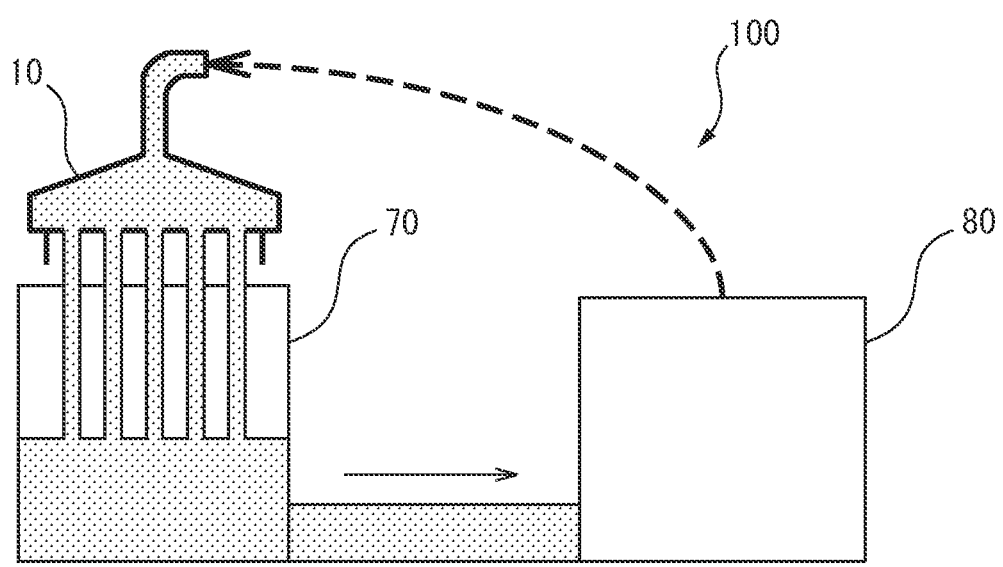
FIG. 6 is a schematic view showing an evaluation device used in the Examples.

As shown in FIG. 6, in an environmental test chamber in which the temperature and humidity can be changed, a solution receptacle (70) was arranged on the shower nozzle (10) side. A circulation pump (80) was set in the solution receptacle (70), and a continuous solution discharge device (100) was configured so that solution could be supplied to the shower nozzle (10).

The continuous solution discharge device was filled with the solution containing catalyst metal, and the solution was set to be automatically discharged in 25-second cycles. The environmental test chamber was set at 25° C., and the humidity was set according to each Example. After confirming that the temperature and the humidity had reached the set values, continuous discharge of the solution containing catalyst metal was started. Ten hours after the start of the continuous discharge of the solution, continuous discharge was completed, and the clogging rate of the discharge opening of the shower nozzle was confirmed. The clogging rate [%]=(the number of clogged discharge openings)/(total number of discharge openings)×100.

Examples 1 to 18 and Comparative Examples 1 to 12

According to each example, evaluation was performed by changing the length of the guard of the shower nozzle, the guard position, and the viscosity and the humidity of the solution as shown in Table 1. In each example, the average aperture diameter of the discharge opening was 1.2 mm.

Figure 7:
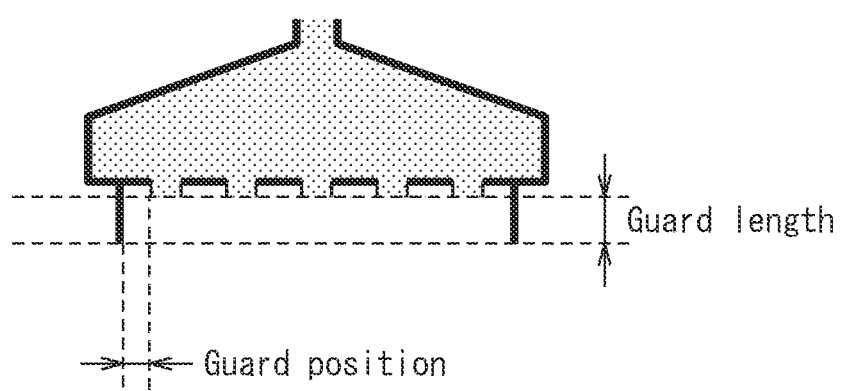
FIG. 7 shows how the dimensions of the guard of the nozzle used in the Examples are measured.

As used herein, the viscosity of the solution is the value of the viscosity at a shear rate of 4 s$^{-1}$, and viscosity was adjusted by changing the amount of thickener. The length of the guard and the position of the guard were determined as shown in FIG. 7. In other words, the length of the guard is the length that the guard further protrudes downwardly from the convex portion of the shower nozzle, and the position of the guard is the distance between the outer periphery of the hole of the discharge opening on the outermost side of the nozzle and the guard.

The results are shown in Tables 1 to 3.

TABLE 1

| | Humidity [%] | Discharge Opening Average Aperture Diameter [mm] | Guard Length [mm] | Guard Position [mm] | Viscosity [mPa·s] | Clogging Rate [%] |
|---|---|---|---|---|---|---|
| Comp Ex 1 | 15 | 1.2 | — | — | 20 | 65 |
| Comp Ex 2 | 30 | 1.2 | — | — | 20 | 45 |
| Comp Ex 3 | 45 | 1.2 | — | — | 20 | 0 |
| Comp Ex 4 | 15 | 1.2 | — | — | 750 | 56 |
| Comp Ex 5 | 30 | 1.2 | — | — | 750 | 38 |
| Comp Ex 6 | 45 | 1.2 | — | — | 750 | 0 |
| Comp Ex 7 | 15 | 1.2 | — | — | 1500 | 10 |
| Comp Ex 8 | 30 | 1.2 | — | — | 1500 | 0 |
| Comp Ex 9 | 45 | 1.2 | — | — | 1500 | 0 |

TABLE 2

| | Humidity [%] | Discharge Opening Average Aperture Diameter [mm] | Guard Length [mm] | Guard Position [mm] | Viscosity [mPa·s] | Clogging Rate [%] |
|---|---|---|---|---|---|---|
| Comp Ex 1 | 15 | 1.2 | — | — | 20 | 65 |
| Comp Ex 2 | 30 | 1.2 | — | — | 20 | 45 |
| Comp Ex 3 | 45 | 1.2 | — | — | 20 | 0 |
| Ex 1 | 15 | 1.2 | 5 | 6 | 20 | 28 |
| Ex 2 | 15 | 1.2 | 15 | 6 | 20 | 0 |
| Ex 3 | 15 | 1.2 | 35 | 6 | 20 | 0 |
| Ex 4 | 30 | 1.2 | 5 | 6 | 20 | 18 |
| Ex 5 | 30 | 1.2 | 15 | 6 | 20 | 0 |
| Ex 6 | 30 | 1.2 | 35 | 6 | 20 | 0 |
| Ex 7 | 45 | 1.2 | 5 | 6 | 20 | 0 |
| Ex 8 | 45 | 1.2 | 15 | 6 | 20 | 0 |
| Ex 9 | 45 | 1.2 | 35 | 6 | 20 | 0 |

TABLE 3

| | Humidity [%] | Discharge Opening Average Aperture Diameter [mm] | Guard Length [mm] | Guard Position [mm] | Viscosity [mPa·s] | Clogging Rate [%] |
|---|---|---|---|---|---|---|
| Comp Ex 10 | 15 | 1.2 | 15 | 2 | 20 | 0 |
| Comp Ex 11 | 30 | 1.2 | 15 | 2 | 20 | 0 |
| Comp Ex 12 | 45 | 1.2 | 15 | 2 | 20 | 0 |
| Ex 13 | 15 | 1.2 | 15 | 4 | 20 | 0 |
| Ex 14 | 30 | 1.2 | 15 | 4 | 20 | 0 |
| Ex 15 | 45 | 1.2 | 15 | 4 | 20 | 0 |
| Ex 2 | 15 | 1.2 | 15 | 6 | 20 | 0 |
| Ex 5 | 30 | 1.2 | 15 | 6 | 20 | 0 |
| Ex 8 | 45 | 1.2 | 15 | 6 | 20 | 0 |
| Ex 16 | 15 | 1.2 | 15 | 10 | 20 | 15 |
| Ex 17 | 30 | 1.2 | 15 | 10 | 20 | 12 |
| Ex 18 | 45 | 1.2 | 15 | 10 | 20 | 0 |

From the comparison of Comparative Examples 1 to 9, it was found that when the humidity was low and the viscosity of the solution was low (when the amount of the thickener was small), clogging often occurred. Conversely, from the results of Examples 1 to 18, it is understood that when the guard is lengthened, clogging is less likely to occur even when the humidity is low and the viscosity is low. It can be understood that the position of the guard is important, and by arranging the guard very close to the discharge opening, clogging is unlikely to occur even when the humidity is low and the viscosity is low.

REFERENCE SIGNS LIST 10 shower nozzle
11 guard
12 discharge opening
13 rectifying plate 15 protrusion
20 solution containing catalyst metal
30 honeycomb substrate
40 guide
50 support
60 duct
70 solution receptacle
80 circulation pump
100 continuous solution discharge device

The invention claimed is:

1. A production method of an exhaust gas purification device, comprising the steps of:
    supplying a solution containing a catalyst metal from a shower nozzle to an upper part of a honeycomb substrate;
    coating the honeycomb substrate with the solution; and
    firing the honeycomb substrate coated with the solution,
    wherein the shower nozzle has a plurality of discharge openings configured to discharge the solution and a guard configured to surround and moisten the plurality of discharge openings during the supplying of the solution so as to prevent clogging of the plurality of discharge openings.

2. The production method according to claim 1, wherein the guard protrudes from the discharge openings of the shower nozzle by a length of 5 mm or more.

3. The production method according to claim 1, wherein an average distance between the guard and the discharge opening nearest to the guard is 1 mm or more and 20 mm or less.

4. The production method according to claim 1, wherein an average aperture diameter of the discharge openings is 0.3 mm or more and 3 mm or less.

5. The production method according to claim 1, wherein the discharge openings of the shower nozzle are located on a convex portion of the shower nozzle.

6. The production method according to claim 1, wherein the viscosity of the solution at a shear rate of 4 $s^{-1}$ is 1 mPa·s or more and 20000 mPa·s or less.

7. The production method according to claim 1, wherein the supplying of the solution from the shower nozzle includes using a guide to prevent leakage of the solution from the upper part of the honeycomb substrate.

* * * * *